United States Patent [19]

Goodhue et al.

[11] Patent Number: 4,956,844
[45] Date of Patent: Sep. 11, 1990

[54] TWO-DIMENSIONAL SURFACE-EMITTING LASER ARRAY

[75] Inventors: William D. Goodhue, Chelmsford; Kurt Rauschenbach, Marlboro; Christine A. Wang, Bedford, all of Mass.

[73] Assignee: Massachusetts Institute of Technology, Cambridge, Mass.

[21] Appl. No.: 325,292

[22] Filed: Mar. 17, 1989

[51] Int. Cl.$^5$ .............................................. H01S 3/00
[52] U.S. Cl. ......................................... 372/44; 372/99
[58] Field of Search ............................. 372/44, 49, 99

[56] References Cited

U.S. PATENT DOCUMENTS

| | | | |
|---|---|---|---|
| 3,996,492 | 12/1976 | McGroddy | 313/500 |
| 3,996,528 | 12/1976 | Blum et al. | 372/44 |
| 4,047,124 | 9/1977 | Comerford et al. | 331/94.5 |
| 4,663,476 | 12/1986 | Scifres et al. | 372/45 |
| 4,718,070 | 1/1988 | Liau et al. | 372/50 |
| 4,760,578 | 7/1988 | Oshima et al. | 372/45 |

OTHER PUBLICATIONS

"Surface Emitting Laser Diode with Bent Waveguide", Ogura et al., Appl. Phys. Lett. 50(12), Mar. 23, 1987, pp. 705-707.
"Phase-Locked Operation of Coupled Pairs of Grating-Surface-Emitting Diode Lasers", Hammer et al., Appl. Phys. Lett., 50(11), Mar. 16, 1987, pp. 659-661.
"Surface Emitting Laser Diode with $Al_xGa_{1-x}As$/GaAs Multilayered Heterostructure", Ogura et al., J. Vac. Sci. Technol. B3(2), Mar./Apr. 1985, pp. 784-787.
"Monolithic-Two-Dimensional Surface-Emitting Arrays of GaAs/AlGaAs Diode Lasers", Donnelly et al., Appl. Phys. Lett., 52(15), Oct. 12, 1987, pp. 1138-1140.
"Angular Chlorine Ion-Beam-Assisted Etching of GaAs and AlGaAs", Goodhue et al., 1986 Inst. Phys. Conf., Ser. No. 83: Ch. 7, pp. 349-354.
"Recent Progress in Surface-Emitting Lasers", Iga et al., Technical Digest Series, Topical Meeting on Semiconductor Lasers, vol. 6, Feb. 10-11, 1987, pp. 99-105.
"Lasing Characteristics of Improved GaInAsP/InP Surface Emitting Injection Lasers", Iga et al., Electronics Letters, Jun. 23, 1983, vol. 19, No. 13, pp. 457-458.
"Room-Temperature Pulsed Oscillation of GaAlAs/GaAs Surface Emitting Injection Lawer", Iga et al., Appl. Phys. Lett., 45(4), Aug. 15, 1984, pp. 348-350.
"Novel Double-Heterostructure Lasers", Spring-Thorpe et al., International Electron Devices Meeting, 1977, pp. 571-574.

Primary Examiner—William L. Sikes
Assistant Examiner—Robert E. Wise
Attorney, Agent, or Firm—Hamilton, Brook, Smith & Reynolds

[57] ABSTRACT

An improved two-dimensional semiconductor surface-emitting laser array is described in which two intracavity internal reflecting surfaces are formed at a 45° angle to the plane of the active layer of the semiconductor laser so as to internally reflect light from each end of the active layer in a direction normal to the plane of the active layer with a buried reflective mirror provided in the path of one of said reflections, so as to transmit reflected light back through the laser and out the top surface of the array.

18 Claims, 4 Drawing Sheets

TWO-DIMENSIONAL SURFACE-EMITTING LASER ARRAY

GOVERNMENT SPONSORSHIP

The United States Government has rights to this invention pursuant to the United States Air Force Contract No. F19628-85-C-0002.

TECHNICAL FIELD

This invention relates to semiconductor lasers and, more particularly, to an array of surface-emitting laser devices.

BACKGROUND OF THE INVENTION

Conventional semiconductor lasers are formed of layers of III/V material, or alloys thereof, on substrate surfaces. Such layers form a cavity structure generally comprising successive layers of vapor phase epitaxy (VPE) or molecular beam epitaxy (MBE) deposited layers as follows: an n+type lower buffer layer an n-type lower cladding or confinement layer; an undoped active layer; a p-type upper cladding or confinement layer and a p±-type contacting layer. Mirror facets are formed on both sides or ends of the layered structure, usually by cleaving the wafer perpendicular to the plane of the active layer. The two mirror surfaces and the active layer form a resonant optical cavity.

When current is applied across the layers, a non-equilibrium concentration of holes and electrons occurs in the active layer sandwiched between the upper p-type layer and lower n-type layer. When the holes and electrons recombine, photons are emitted out one of the faceted edges of the active layer in a direction perpendicular to the direction of current flow through the device. Such lasers can be categorized as laser edge-emitting devices.

Linear arrays of such edge-emitting devices have been formed in an attempt to achieve higher power levels than can be attained in a single device. Still higher power levels have been achieved by stacking and bonding these arrays to form composite two-dimensional arrays.

Those skilled in the art have also attempted to modify the geometry of light production in such devices so that the laser light is emitted in a direction perpendicular to the plane of the active layer or p/n junction to produce so-called surface-emitting lasers (SELs). Monolithic two-dimensional SEL arrays offer the opportunity for obtaining high power with high yield and reproducibility.

The SEL monolithic laser array devices fall into the following three general categories:

1. Angled Facets

Arrays in which the mirror facets are angled in opposite directions at about 45°. The facets are either etched, cleaved, or are formed by a combination of both etching and cleaving or mass transport formation. The etched opposed 45° structures are shown in J. P. Donnelly et al., "Monolithic Two-Dimensional Surface-Emitting Arrays of GaAs/AlGaAs Diode Lasers", *App. Phys. Lett.* 51, Oct. 12, 1987, pp. 1138–1140 and U.S. Pat. No. 4,760,578 issued July 26, 1988, "Semiconductor Laser with a Controllable Transmittance Layer". The cleaved structure is described in U.S. Pat. No. 3,996,492, "Two-Dimensional Integrated Injection Laser Array", McGroddy, J., issued Dec. 7, 1976. The combination etched/cleaved is shown in A. J. SpringThorpe, M. J., et al. "Novel Double-Heterostructure Lasers", *International Electron Devices Meeting*, 1977, pp. 571–574 and the mass transport structures in U.S. Pat. No. 4,718,070, "Surface Emitting Diode Laser", Zong-Long Liau and James N. Walpole, issued Jan. 5, 1988.

2. Vertical Cavity

Vertical cavity laser structures; in which the cavity resonator is oriented perpendicular to the p/n junction. (See "Topical Meeting on Semiconductor Lasers", *Technical Digest Series*, Volume 6, Feb. 10–11, 1987, pp. 99–105 and K. Iga et al., "Lasing Characteristics of Improved GaInAsP/InP Surface Emitting Injection Lasers", *Electronics Letters*, 23rd June 1983, Vol. 19, No. 13, pp. 457–458) and (K. Iga et al., "Room Temperature Pulsed Oscillation of GaAlAs/GaAs Surface Emitting Injection Laser", *Appl. Phys. Lett.* 45(4), Aug. 15, 1984, pp. 348–350.)

3 DBR Structures

Second order distributed Bragg reflector (DBR) grating lasers; in which DBR gratings are formed parallel to the laser p/n junction and interact with the laser cavity and emit light normal to the p/n junction. (See J. M. Hammer et al., "Phase-Locked Operation of Coupled Pairs of Grating-Surface-Emitting Diode Lasers", *Appl. Phys. Lett.* 50(11), Mar. 16, 1987, pp. 659–661).

The opposed 45° etched or cleaved structures are difficult to fabricate and reliably reproduce. The mass transport structures have been restricted in practice to III-V materials other than AlGaAs because of difficulty in thermal mass transport of aluminum compounds. The vertical structures have inherent power limitations caused by the short cavity dimensions in vertical devices. DBR gratings are difficult to form and are inherently low power devices, since the output power results from harmonic generation. Accordingly, despite prolonged intensive research in the technology of SEL two-dimensional laser arrays, a need still exists for an array which is relatively easy to fabricate and reproduce, yet is capable of relatively high power operation using III-V compounds or alloys thereof.

DISCLOSURE OF THE INVENTION

In accordance with the invention, a method and apparatus for a two-dimensional surface-emitting laser array is provided herein. The array is comprised of many laser cavities, each formed on a single substrate. Each laser cavity consists of an active lasing region with intra-cavity reflective mirrors at each end and a feedback region beyond the reflective mirrors to sustain oscillation. The active lasing region is formed by a confined active lasing layer sandwiched between two cladding layers. The active lasing layer extends in a horizontal plane in a longitudinal direction. The active lasing region is formed of semiconductor material in the conventional manner with at least a lower n-type cladding layer, an upper p-type cladding layer and an undoped active layer sandwiched between the two. Sidewalls formed at each end of the active lasing region and angled at the same 45° angle to the plane of the active layer form the intracavity mirrors with internally reflective surfaces. Light emitted from the active layer is thus deflected, in opposite directions normal to the plane of the active layer at each end. At one end, the light is deflected to a lower high reflectivity mirror, while at the other end, the light is deflected through the top cladding layers and out the surface of the array. Preferably, the high reflectivity mirror is formed by depositing pairs of alternate quarter-wavelength reflective layers on the substrate before the laser cavity is formed.

Light emitted from one end of the active layer is internally reflected by one 45° sidewall in a downward direction and encounters the buried reflective layers of the high reflectivity mirror and is reflected off these layers back through the laser cavity and encounters the other 45° sidewall and is internally reflected upwardly through the upper cladding layer and the top semiconductor layer where it is partially reflected back into the active layer and partially transmitted normal to the plane of the active layer. The 45° sidewalls are preferably formed by ion-beam assisted etching (IBAE), a procedure described, in general, in "Gallium Arsenide and Related Compounds", 1986 Inst. Phys. Conf. Ser. No. 83: Ch. 7, pp. 349-354. Because all sidewalls are inclined at the same angle, the intra-cavity mirrors can be produced by a single angle etch. This is an important consideration in simplifying the process of fabricating SEL arrays.

DETAILED DESCRIPTION OF THE INVENTION

Figure 1:
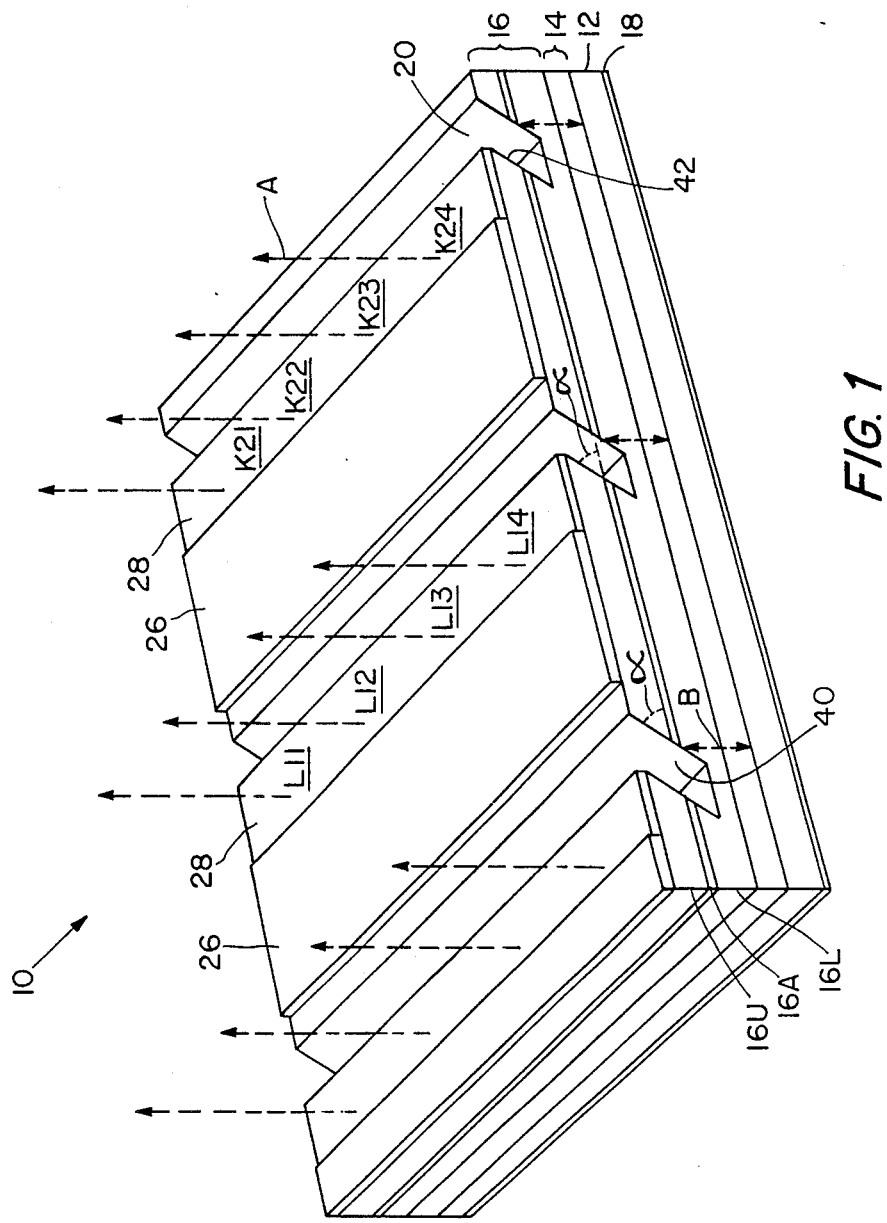
FIG. 1 is a partial perspective view of a portion of a surface-emitting array of the invention.

The invention will now be described in connection with FIGS. 1 and 2 of the drawings. FIG. 1 shows a preferred embodiment of a two-dimensional surface-emitting array, in accordance with the invention. The array is shown generally at 10 to comprise a plurality of laser-emitting devices, for example, four per column, such as L11–L14 and K21–K24, formed on a substrate 12 in columns and rows. Preferably substrate 12 is formed of a III-V type compound, or alloy thereof, such as gallium arsenide, which is made n±-type by silicon doping. On this substrate, a dielectric light reflective stack of alternate quarter wavelength layers are formed by molecular beam epitaxy or organo-metallic vapor phase epitaxy. These layers are shown at 14 and comprise, for example, a first $Ga_xAl_yAs$ layer followed by a $Ga_xAl_yAs$ layer, wherein for the first layer, X is 0.2 and Y is 0.8 and for the next layer, X is 0.8 and Y is 0.2.

A plurality of these layers form a high reflectivity mirror, the reflectivity of which can be controlled by the number of layers and the relative mole fractions. Preferably a series of these layers are formed to produce at least 90% reflectivity.

Upon these reflective layers, a single quantum well lasing device is symmetrically positioned in a large optical cavity. Preferably this is accomplished by epitaxially depositing the following successive layers: a 1 micron n+gallium arsenide buffer layer 16a; a 1 micron n-type $Al_{0.5}Ga_{0.5}As$ confinement layer 16b, a 0.12 micron undoped $Al_{0.3}Ga_{0.7}$ arsenide layer 16c; a 0.2 micron undoped $Al_{0.1}Ga_{0.9}As$ active layer 16d; a 0.12 micron undoped $Al_{0.3}Ga_{0.7}As$ layer 16e, 1.8 micron p-type $Al_{0.5}Ga_{0.5}As$ confinement layer 16f and a 0.1 micron p+GaAs contacting layer 16g (See FIG. 2a).

The two 0.12 micron undoped $Al_{0.3}Ga_{0.7}As$ layers 16c and 16e on either side of the active layer 16d form a large optical cavity extending in a horizontal plane.

For simplicity of description, the layers 16a–g have been shown in FIG. 1 and subsequent FIGS. 2b–2j as an upper cladding layer 16U, a lower cladding layer 16L and an active lasing layer 16A. Next, the regions where the laser intra-cavity mirrors are to be formed are defined by lithography such that photoresist 17 is applied and developed to form a mask exposing underlying facet regions (See FIG. 2b). The wafers are mounted on a 45° angle stage and etched, preferably using the IBAE process above described (See FIG. 2c). The width of the etched opening is about 6 microns and the depth about 7 microns; which is deep enough to collect all the light reflected from mirror 14.

Figure 2A:
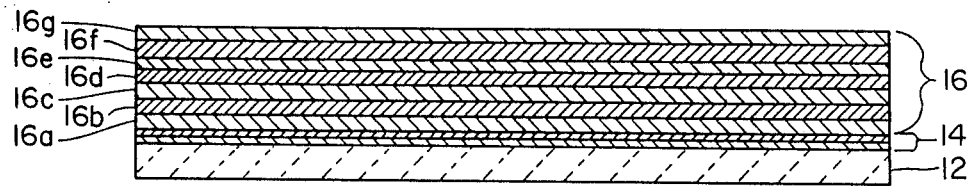
FIG. 2(a–j) is a schematic cross-sectional process flow diagram of the major steps necessary for fabricating the array of FIG. 1.
Figure 2B:
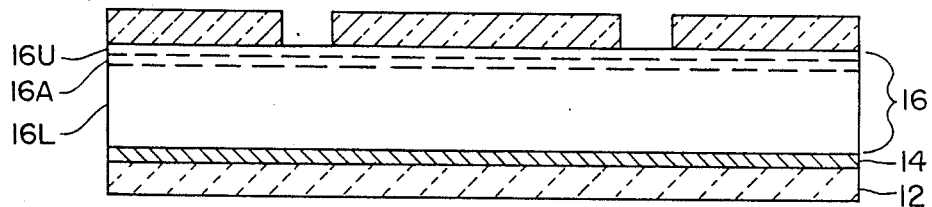
Figure 2C:
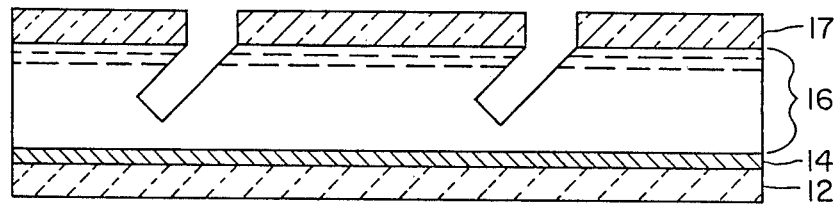
Figure 2D:
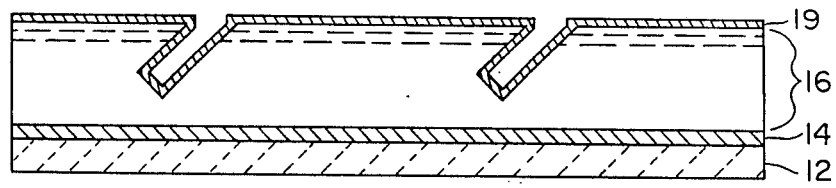
Figure 2E:
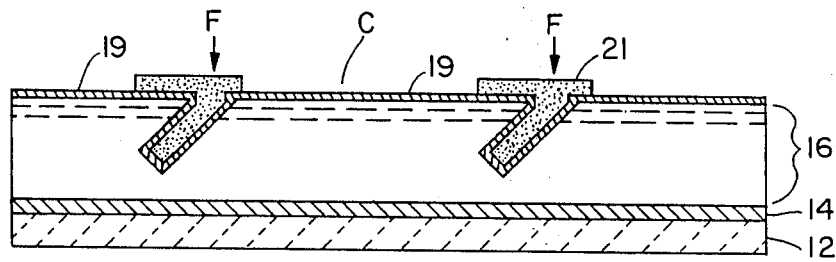
Figure 2F:
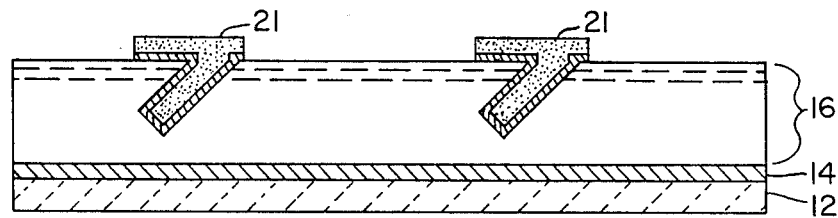
Figure 2G:
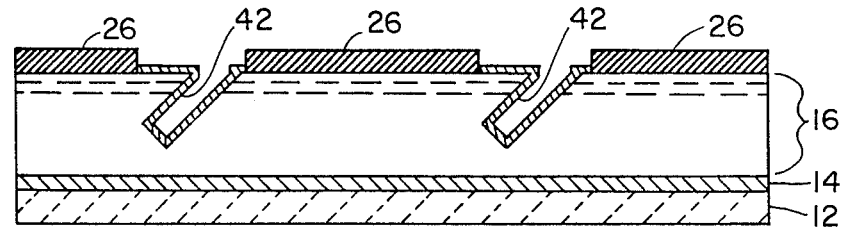

The resist 17 is removed and a conformal passivating coating 19, such as $SiO_2$ or $Si_3N_4$ is applied over the wafer (See FIG. 2d). Next, resist 21 is applied, exposed and developed using conventional photolithography to define a top contact transverse stripe region C between the two facet regions F (FIG. 2e). The oxide 19 is removed in the contact region (FIG. 2f) and p-type metallization (i.e., Cr/Au) 26 is deposited in its place.

Figure 3:
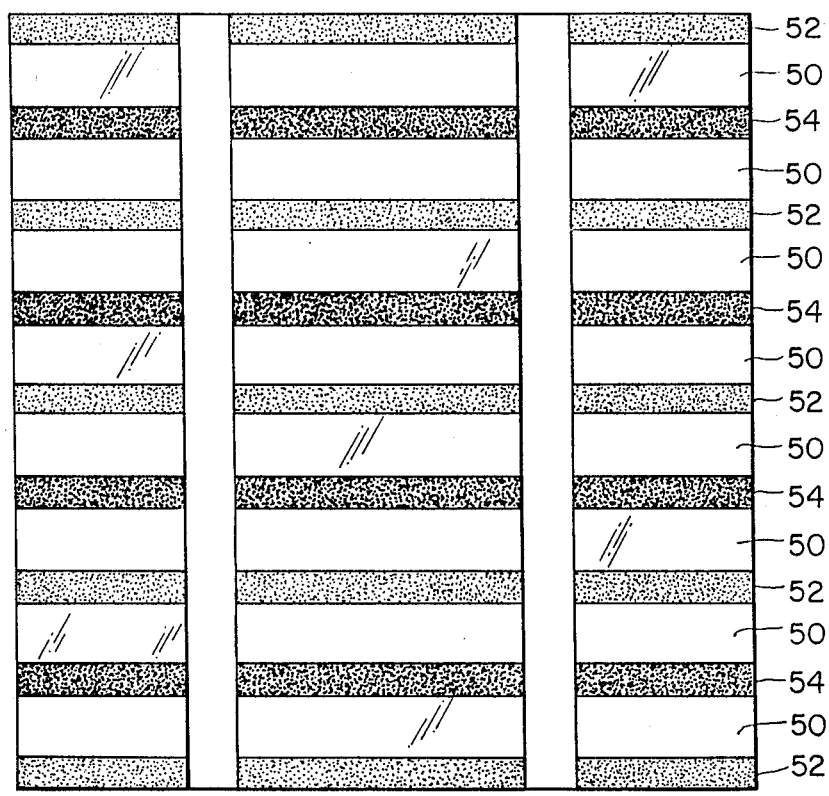
FIG. 3 is a top plan view of the structure of FIG. 2 at one step in the process showing the proton implantation confining stripes.

Optionally, at this point, or at any time after intra cavity deflecting mirrors are defined, proton bombardment is used for device isolation. This step in the process is illustrated in FIG. 3 which is a simplified plan view of one column of the array viewed from above. In this step, proton bombardment is used for device isolation.

Two types of proton implants are used. Shallow implants are made in the regions 50 to confine the laser light transversely. Deep implants are made through the optical cavity in the regions 52 to eliminate transverse lasing. The laser light is thus confined to the remaining region 54.

Figure 2H:
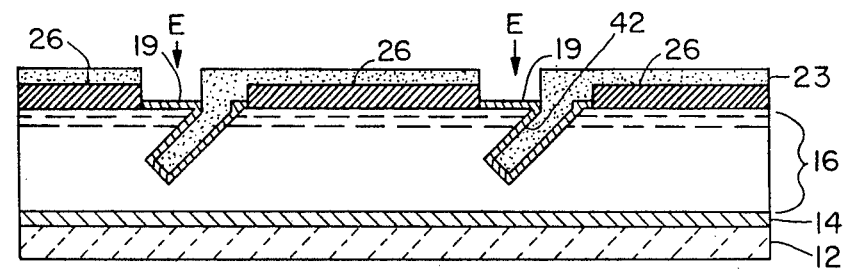
Figure 2I:
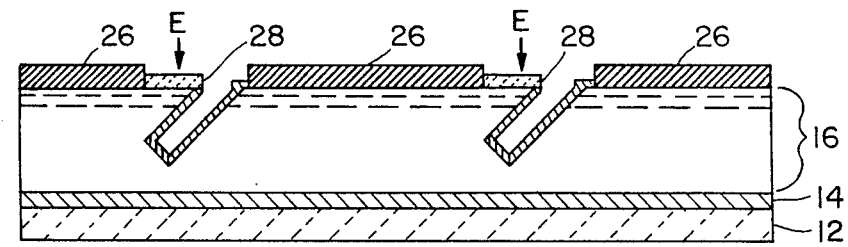
Figure 2J:
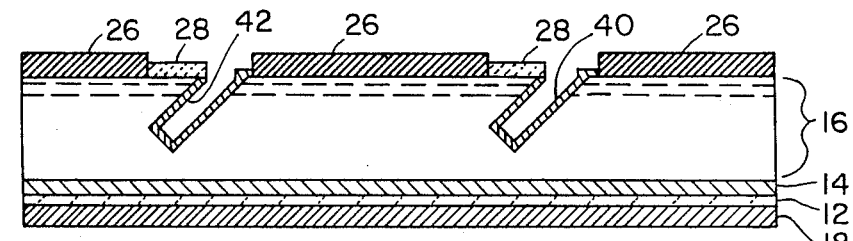

After proton bombardment, the region E, above the light-emitting facets 52, are defined by photolithography and resist 23 is developed out in these regions, exposing oxide 19 at these regions E (FIG. 2h). The oxide 19 and the top p+GaAs layer 16g (See FIG. 2a) is removed in this region by etching. This is advisable because the p+contact layer 16g is relatively highly absorptive at the frequency of the GaAs laser. A suitable selective GaAs/AlGaAs etchant is $H_2O_2/NH_4OH$ 25:1. The etch rate of this etchant greatly diminishes when it reaches the AlGaAs layer.

After etching, the oxide and GaAs contacting layers a dielectric material 28, such as $Al_3O_2$, $SiO_2$, or $ZrO_2$, is applied to the regions E for passivation. This will prevent the surface of the output region from oxidizing and degrading. The $ZrO_2$ also serves as an anti-reflection coating. The reflectivity of the output surface may also be varied by alternate coats of $SiO_2$ and $ZrO_2$ to form a dielectric stack (See FIG. 2i). Finally, the bottom of the wafer is thinned n-type metallization, i.e., Ni/Au/Ge 18 is applied to form the bottom n-type contact; and the contact is alloyed or sintered by heat treatment (See FIG. 2j).

In this manner, a first internally reflective surface 40 is formed at one end of the active region while a second internally reflective surface 42 is formed at the other end of the active region. Each reflective surface, as shown in FIG. 1, bisects the plane of the active layer 16b at an angle α which is preferably in the order of 45°, so as to form an internal reflecting surface which reflects light emitted from the active layer in a direction (shown by the arrows A and B in FIG. 1) which is substantially perpendicular to the plane of the active layer. Total internal reflection occurs because of the large refractive index difference between the semiconductor surface and air. The B arrows are directed downwardly towards the substrate and indicate that light is reflected off the buried reflecting layers 14 back to the internal reflecting surface 40 through the active region and internally reflected off the internal reflecting surface 42 at the other end in the direction of the arrows A. Note that unlike other prior art devices, each of the angles $\alpha$ at the ends of the resonating cavity are inclined at the same 45° angle and in the same direction, thus providing internal reflector surfaces at both ends of the active layer.

This has a number of advantages. Dry etching times are shortened, since only one angle etch is required. The structure is relatively simple and is ideal for use in an external cavity lasing system because the output mirror can be easily anti-reflection coated. The reflectivity of the output mirror can be easily changed by coating the readily accessible surface of the output mirror with dielectric layers.

EQUIVALENTS

This concludes the description of the preferred embodiment of the invention. It should be noted that while the invention has been described in connection with the III/V materials, aluminum gallium arsenide, other well known III/V materials may be substituted for the above, such as indium phosphide, gallium phosphide. etc. Furthermore, other techniques may be employed for etching the 45° intra-cavity mirrors, such as wet chemical, reactive-ion etching and mass-transport. However, ion-beam assisted etching is the technique of choice, because of its anisotropy, surface quality, and well-developed technology. Other lasers may be employed, such as heterojunctions of quarternary III/V alloys, for example, of indium gallium arsenide phosphide or multiple quantum well (MQW) or GRINCH (Graded Refractive Index Confinement Heterostructure) devices. Compounds and alloys of II-VI semiconductors, may also be utilized. Other confinement techniques may be employed, such as, etched mesas or dielectric (oxide/nitride) confinement.

It will therefore be apparent to those skilled in the art, based on the present description, that many modifications and variations may be made without departing from the scope of the present invention.

What is claimed is:

1. A two-dimensional semiconductor surface-emitting laser array formed of a plurality of laser cavities each comprising:
   (a) an active layer of lasing semiconductor material for emitting rays of light extending longitudinally in a plane between two semiconductor layers;
   (b) a first intra-cavity reflective surface formed at one end of said layer and bisecting the plane of said active layer at an angle which internally reflects said light rays from said layer in a first direction approximately normal to said plane;
   (c) a second intra-cavity reflective surface formed at an opposite end of said layer and bisecting said plane at about the same angle as in (b) to internally reflect light rays from said layer in a second direction opposite said first direction and approximately normal to said plane;
   (d) a light reflective mirror formed in the path of said second direction.

2. The array of claim 1 wherein the reflective mirror is comprised of layers of semiconductor dielectric material formed in parallel to said active layer in the path of one of said light rays to redirect said light rays back through said active layer.

3. The array of claim 1 wherein the array is comprised of layers of semiconductor material forming waveguiding regions above and below said active layer and the first and second reflective surfaces are formed by etching semiconductor material to bisect said active layer at an angle of about 45° from the plane of said active layer leaving an air gap at each end having two sidewalls, each of which is inclined in the same direction at said angle of about 45° from the plane of said active layer.

4. The array of claim 1 further including an output mirror formed in the path of said first direction.

5. The array of claim 4 wherein the output mirror is formed on an external surface of said array.

6. The array of claim 1 wherein the lasing semiconductor material is formed of III-IV material.

7. In a method for forming two-dimensional semiconductor surface-emitting laser arrays the improvement comprising:
   (a) forming a first light reflective mirror structure on a substrate;
   (b) forming a light-emitting device over said first mirror structure with a layer of light-emitting semiconductor material extending along a plane parallel to said substrate for emitting light extending in said plane;
   (c) removing semiconductor material from said device at opposite ends thereof at an angle of about 45° to said plane forming intra-cavity light reflecting surfaces at each end of said device which surfaces deflect said light in opposite directions normal to said plane;
   (d) forming an output mirror on said light-emitting device over one of said light reflective intra-cavity surfaces;
   (e) forming contacts on the surface of said device and said substrate.

8. The method of claim 7 wherein the light-emitting device is a III-V heterostructure laser.

9. The method of claim 8 wherein the III-V heterostructure is formed of AlGaAs and GaAs layers.

10. The method of claim 7 wherein the first mirror structure is formed of alternate quarter wavelength III-V layers.

11. The method of claim 7 wherein the light-emitting device includes a first doped contacting layer and includes the step of removing said contacting layer in the region where said output mirror is formed.

12. The method of claim 11 wherein the mirror is passivated.

13. The method of claim 12 wherein the mirror is coated with an anti-reflective coating.

14. The method of claim 12 wherein the mirror is coated with material to adjust the reflectivity of the mirror.

15. The method of claim 7 wherein the semiconductor material is removed by ion-beam assisted etching.

16. The method of claim 7 wherein the output mirror is coated with $Al_3O_2$, $SiO_2$, $ZrO_2$, or a combination thereof.

17. The method of claim 7 wherein the reflective surfaces are formed by etching semiconductor material to bisect said plane at an angle of about 45°, leaving an air gap at each end having two sidewalls, each of which is inclined in the same direction at said angle of about 45° from the plane of said active layer.

18. In a semiconductor surface-emitting laser array having an active layer of lasing semiconductor material for emitting rays of light extending longitudinally in a plane between two semiconductor layers, the improvement comprising:

(a) a first intra-cavity reflective surface formed at one end of said active layer and bisecting the plane of said active layer at an angle which internally reflects said light rays from said layer in a first direction approximately normal to said plane; and (b) a second intra-cavity reflective surface formed at an opposite end of said layer and bisecting said plane at about the same angle as in (a) to internally reflect light rays from said layer in a second direction opposite said first direction and approximately normal to said plane; and (c) a light reflective mirror formed in the path of said second direction.

* * * * *